(12) United States Patent
Nakazawa et al.

(10) Patent No.: US 10,964,657 B2
(45) Date of Patent: Mar. 30, 2021

(54) RADIO-FREQUENCY MODULE AND COMMUNICATION DEVICE

(71) Applicant: Murata Manufacturing Co., Ltd., Kyoto (JP)

(72) Inventors: Katsunari Nakazawa, Kyoto (JP); Takanori Uejima, Kyoto (JP); Motoji Tsuda, Kyoto (JP); Yuji Takematsu, Kyoto (JP); Dai Nakagawa, Kyoto (JP); Tetsuro Harada, Kyoto (JP); Masahide Takebe, Kyoto (JP); Naoya Matsumoto, Kyoto (JP); Yoshiaki Sukemori, Kyoto (JP); Mitsunori Samata, Kyoto (JP); Yutaka Sasaki, Kyoto (JP); Yuki Fukuda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 128 days.

(21) Appl. No.: 16/512,790

(22) Filed: Jul. 16, 2019

(65) Prior Publication Data
US 2020/0051942 A1 Feb. 13, 2020

(30) Foreign Application Priority Data
Aug. 9, 2018 (JP) .............................. JP2018-150633

(51) Int. Cl.
*H03F 3/213* (2006.01)
*H03F 3/21* (2006.01)
(Continued)

(52) U.S. Cl.
CPC .......... *H01L 24/16* (2013.01); *H01L 23/5385* (2013.01); *H01L 23/5386* (2013.01);
(Continued)

(58) Field of Classification Search
CPC ..... H01L 24/16; H01L 23/5385; H01L 24/13; H01L 24/14; H01L 23/5386; H01L 23/66;
(Continued)

(56) References Cited

U.S. PATENT DOCUMENTS

| 7,396,701 | B2 * | 7/2008 | Shigemura | .......... H01L 23/3121 |
| | | | | 438/108 |
| 8,742,499 | B2 * | 6/2014 | Nakajima | ............... H01L 23/66 |
| | | | | 257/341 |
| 2010/0109052 | A1 | 5/2010 | Nakajima et al. | |

FOREIGN PATENT DOCUMENTS

JP 2010-267944 A 11/2010

\* cited by examiner

*Primary Examiner* — Hieu P Nguyen
(74) *Attorney, Agent, or Firm* — Peame & Gordon LLP

(57) ABSTRACT

A radio-frequency module includes: a transmission power amplifier that includes first and second amplification transistors that are cascade connected to each other; and a mounting substrate that has first and second main surface that face each other, the transmission power amplifier being mounted on the first main surface. The first amplification transistor is arranged in a final stage and has a first emitter terminal. The second amplification transistor is arranged in a stage preceding the first amplification transistor and has a second emitter terminal. The mounting substrate has first to fourth ground electrode layers in order of proximity to the first main surface. The first emitter terminal and the second emitter terminal are not electrically connected to each other via an electrode on the first main surface and are not electrically connected to each other via the first ground electrode layer.

20 Claims, 6 Drawing Sheets

(51) Int. Cl.
*H03F 1/30* (2006.01)
*H01L 23/00* (2006.01)
*H01L 23/538* (2006.01)
*H01L 23/66* (2006.01)
*H04B 1/04* (2006.01)

(52) U.S. Cl.
CPC .............. *H01L 23/66* (2013.01); *H01L 24/13* (2013.01); *H01L 24/14* (2013.01); *H03F 1/301* (2013.01); *H03F 1/302* (2013.01); *H03F 3/211* (2013.01); *H03F 3/213* (2013.01); *H04B 1/04* (2013.01); *H01L 2223/6644* (2013.01); *H01L 2224/13016* (2013.01); *H01L 2224/13147* (2013.01); *H01L 2224/1403* (2013.01); *H01L 2224/16235* (2013.01); *H01L 2924/1305* (2013.01); *H01L 2924/13091* (2013.01); *H03F 2200/171* (2013.01); *H03F 2200/222* (2013.01); *H03F 2200/294* (2013.01); *H03F 2200/387* (2013.01); *H03F 2200/451* (2013.01); *H03F 2203/21103* (2013.01); *H03F 2203/21139* (2013.01); *H03F 2203/21157* (2013.01); *H04B 2001/0408* (2013.01)

(58) Field of Classification Search
CPC . H01L 2224/16235; H01L 2224/13016; H01L 2924/13091; H01L 2224/1403; H01L 2924/1305; H01L 2224/13147; H01L 2223/6644; H01L 2224/13082; H01L 2924/1421; H01L 2224/14051; H01L 2224/13014; H01L 2224/16227; H01L 2924/181; H01L 2223/6616; H01L 23/49811; H01L 23/5383; H01L 23/3677; H03F 3/211; H03F 1/301; H03F 1/302; H03F 3/213; H03F 2200/451; H03F 2200/387; H03F 2200/222; H03F 2200/294; H03F 2200/171; H03F 2203/21103; H03F 2203/21139; H03F 2203/21157; H03F 3/245; H03F 3/19; H03F 3/195; H04B 1/04; H04B 2001/0408; H04B 1/006; H04B 1/0057; H04B 1/401
USPC ......................................... 330/307, 277, 289
See application file for complete search history.

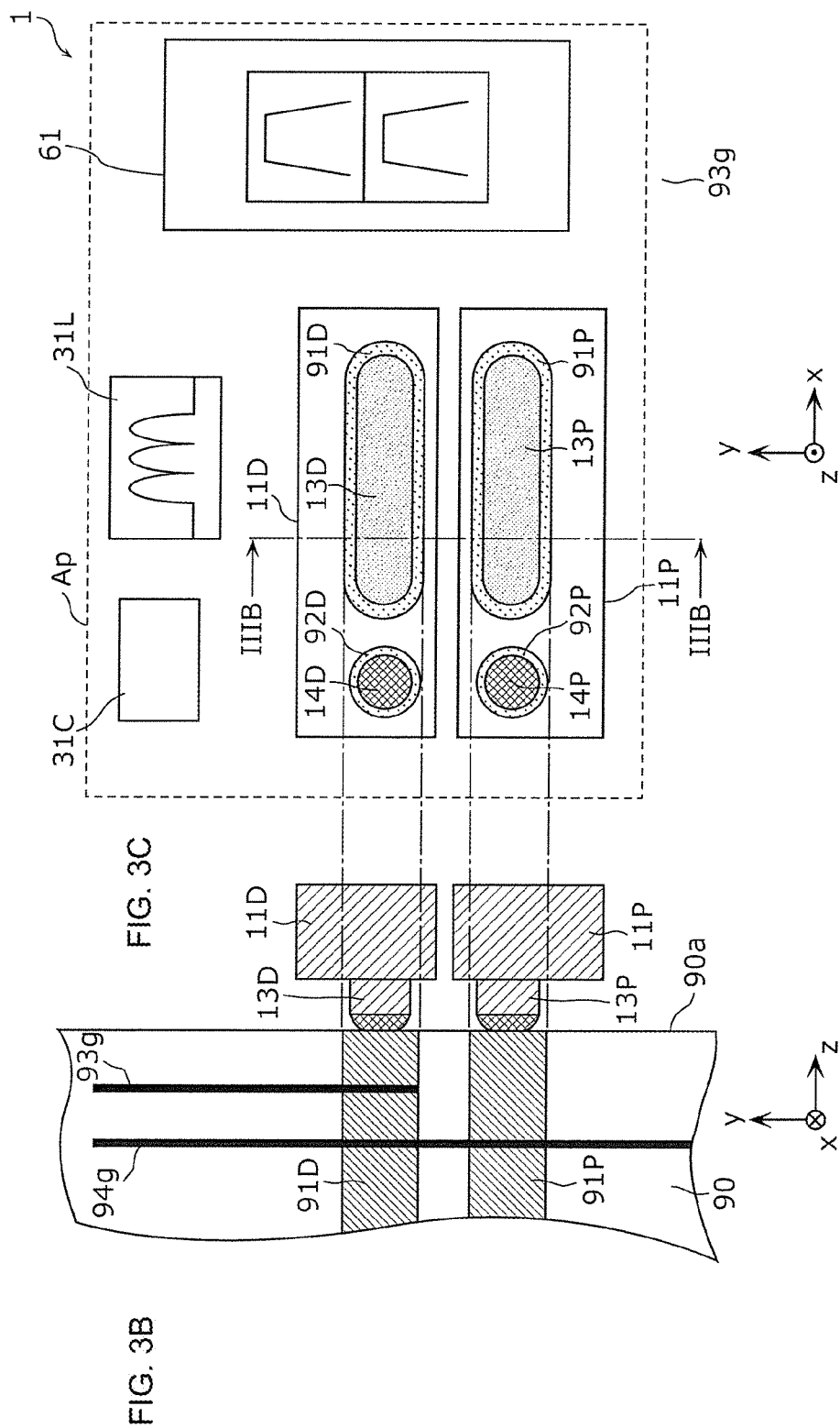

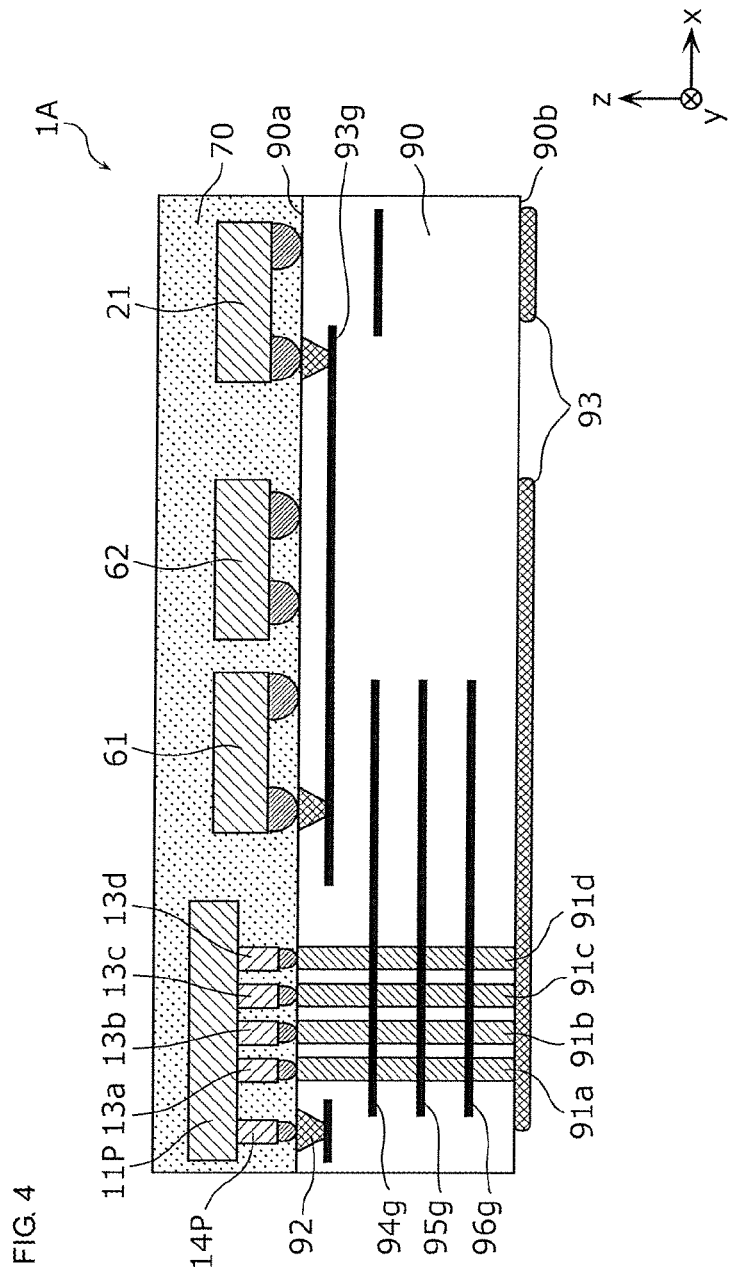

RADIO-FREQUENCY MODULE AND COMMUNICATION DEVICE

This application claims priority from Japanese Patent Application No. 2018-150633 filed on Aug. 9, 2018. The content of this application is incorporated herein by reference in its entirety.

BACKGROUND OF THE DISCLOSURE

1. Field of the Disclosure

The present disclosure relates to a radio-frequency module and a communication device.

2. Description of the Related Art

In mobile communication devices such as mobile phones, with the continuing advancement of multi-band systems, it is particularly necessary to mount the circuit elements constituting a radio-frequency front end circuit at high density. When circuit elements are mounted at high density, it is important that heat dissipation countermeasures be taken for amplification circuits and passive elements through which radio-frequency signals outputted from the amplification circuits flow.

Japanese Unexamined Patent Application Publication No. 2010-267944 discloses a power amplification module having a semiconductor chip that includes a power amplification circuit and a wiring substrate on which the semiconductor chip is mounted. A bump electrode that is connected to a source of the semiconductor chip has a so-called stripe shape obtained by a plurality of spherical bumps being connected to each other in an elongated shape. With this configuration, the power amplification module is able to dissipate heat generated by the power amplification circuit from the bump electrode, which is connected to the source, to a rear surface terminal of the wiring substrate via a plurality of source via conductors (VH1S to VH3S) provided in the wiring substrate.

In general, an effective way to strengthen the degree of grounding and the heat dissipation performance of a power amplification circuit is to connect a ground terminal of the power amplification circuit to a ground electrode layer inside the wiring substrate.

However, in the case where a power amplifier is formed of multiple stages of amplification elements that are cascade connected to each other, in particular, it is assumed that a high-power radio-frequency signal outputted from the amplification element of the final stage (power stage) will flow back around to the amplification element of the preceding stage (drive stage) via a ground electrode layer inside the wiring substrate. In this case, the radio-frequency signal that flows back around to the amplification element of the preceding stage (drive stage) will act as a noise signal, and consequently, the amplification characteristic of the power amplifier will be degraded.

BRIEF SUMMARY OF THE DISCLOSURE

The present disclosure was made in order to solve the above-described problem and it is an object thereof to provide a radio-frequency module and a communication device in which the degradation of the amplification characteristic of a power amplifier is suppressed.

In order to achieve this object, a radio-frequency module according to a preferred embodiment of the present disclosure includes: a power amplifier composed of a plurality of cascade-connected amplification elements; and a mounting substrate that has a first main surface and a second main surface that face each other, the power amplifier being mounted on the first main surface. The plurality of amplification elements includes a first amplification element that is arranged in a final stage of the plurality of amplification elements and has a first ground terminal, and a second amplification element that is arranged in a stage preceding the first amplification element and has a second ground terminal. The mounting substrate includes, inside thereof, a plurality of ground electrode layers that are substantially parallel to the first main surface and consist of first to nth ground electrode layers (n is an integer greater than or equal to 2) in order of proximity to the first main surface. The first ground terminal and the second ground terminal are not electrically connected to each other via an electrode on the first main surface of the mounting substrate and are not electrically connected to each other via the first ground electrode layer.

According to a preferred embodiment of the present disclosure, a radio-frequency module and a communication device can be provided in which the degradation of the amplification characteristic of a power amplifier is suppressed.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

Each of FIGS. 3B and 3C depicts a sectional schematic diagram and a plan view schematic diagram illustrating the mounting arrangement of power amplifiers of the radio-frequency module according to the embodiment; and FIG. 4 is a sectional schematic diagram of a radio-frequency module according to a modification of the embodiment.

DETAILED DESCRIPTION OF THE DISCLOSURE

Figure 1:
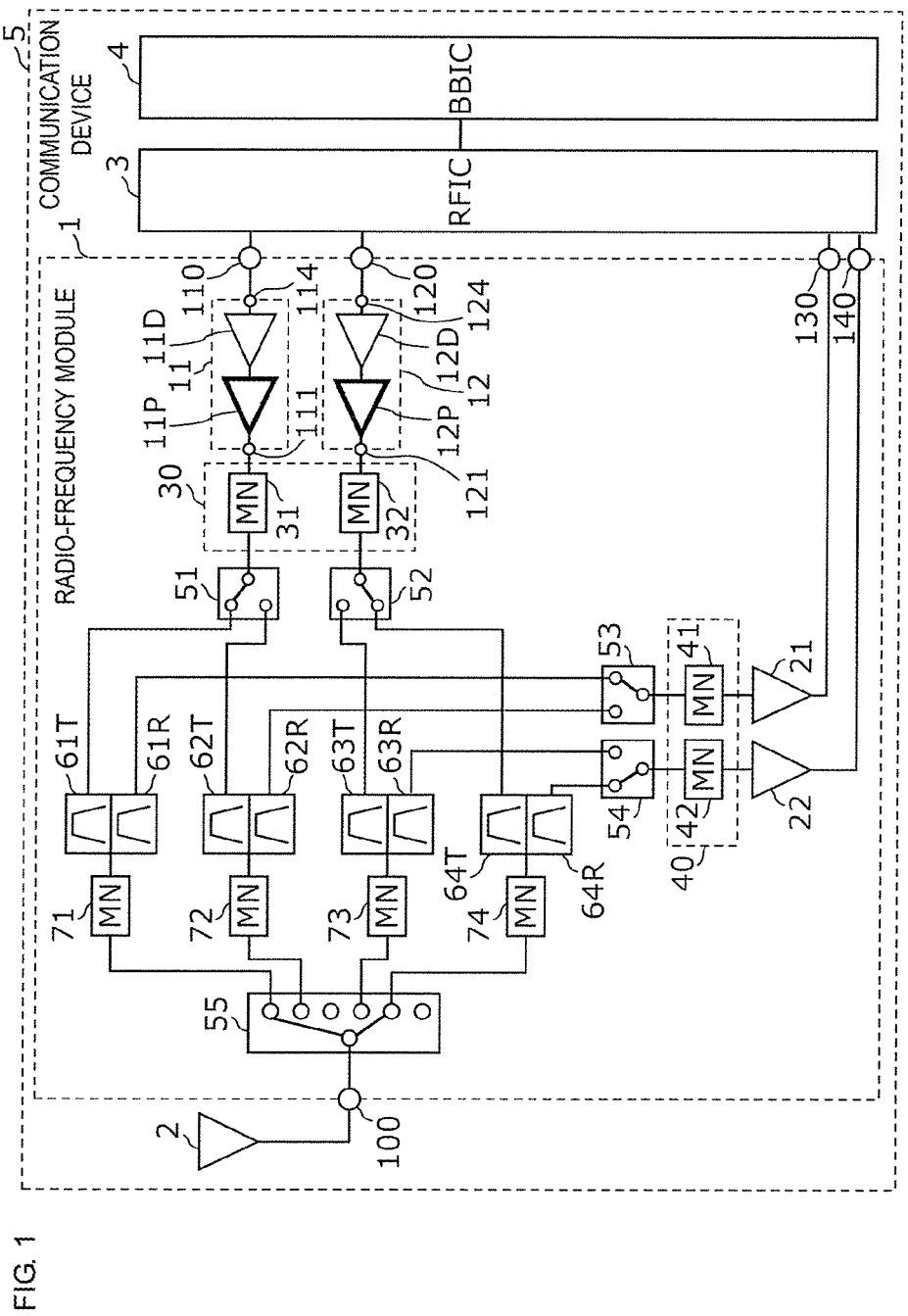
FIG. 1 is a diagram illustrating an example of the circuit configuration of a radio-frequency module according to an embodiment.

Hereafter, an embodiment of the present disclosure and a modification of the embodiment will be described in detail using the drawings. The embodiment and modification described hereafter each illustrate a comprehensive or specific example of the present disclosure. The numerical values, shapes, materials, constituent elements, arrangement of the constituent elements, the ways in which the constituent elements are connected to each other and so forth given in the following embodiment and modification are merely examples and are not intended to limit the present disclosure. Constituent elements not described in the independent claims among constituent elements in the following embodiment and modification are described as arbitrary constituent elements. In addition, the sizes or size ratios between the constituent elements illustrated in the drawings are not necessarily strictly accurate.

In addition, in the following embodiment and modification, "A and B are connected to each other" is defined as indicating either (1) a case in which A and B directly contact each other or (2) a case in which A and B contact each other via a conductive film (A and B are respectively disposed on the front surface and the rear surface of a conductive film). Furthermore, "A and B are electrically connected to each other" is defined as not necessarily meaning that A and B directly contact each other and includes a case in which A and B are indirectly connected to each other via conductive wiring.

Furthermore, in the following embodiment and modification, regarding A, B, and C mounted on a substrate, "C is arranged between A and B in a plan view of the substrate (or a main surface of the substrate)" is defined as indicating that at least part of the projected area of C in a plan view of the substrate overlaps a line that connects an arbitrary point inside the projected area of A in a plan view of the substrate and an arbitrary point inside the projected area of B in a plan view of the substrate.

Embodiment

1. Circuit Configurations of Radio-Frequency Module and Communication Device

FIG. 1 is a circuit configuration diagram of a radio-frequency module 1 according to an embodiment. As illustrated in the figure, a communication device 5 includes the radio-frequency module 1, an antenna element 2, an RF signal processing circuit (RFIC) 3, and a baseband signal processing circuit (BBIC) 4.

The RFIC 3 is an RF signal processing circuit that processes radio-frequency signals transmitted and received by the antenna element 2. Specifically, the RFIC 3 subjects a radio-frequency reception signal inputted thereto via a reception signal path of the radio-frequency module 1 to signal processing using down conversion and so forth and outputs a reception signal generated through this signal processing to the BBIC 4. In addition, the RFIC 3 subjects a transmission signal inputted thereto from the BBIC 4 to signal processing using up conversion and so forth and outputs a radio-frequency transmission signal generated through this signal processing to a transmission signal path of the radio-frequency module 1.

The BBIC 4 is a circuit that performs signal processing using an intermediate frequency band located at a lower frequency than radio-frequency signals that propagate through the radio-frequency module 1. A signal processed by the BBIC 4 is used as an image signal for image display or as an audio signal for a telephone call via a speaker, for example.

Furthermore, the RFIC 3 also functions as a control unit that controls the connections of switches 51, 52, 53, 54, 55, and 56 of the radio-frequency module 1 on the basis of the communication band (frequency band) that is used. Specifically, the RFIC 3 switches connections of the switches 51 to 56 of the radio-frequency module 1 using a control signal (not illustrated). The control unit may be provided outside the RFIC 3, and for example, may be provided in the radio-frequency module 1 or the BBIC 4.

The antenna element 2 is connected to a common terminal 100 of the radio-frequency module 1 and radiates a radio-frequency signal outputted from the radio-frequency module 1 and receives a radio-frequency signal from the outside and outputs the received radio-frequency signal to the radio-frequency module 1.

The antenna element 2 and the BBIC 4 are not essential constituent elements of the communication device 5 according to this embodiment.

Next, the detailed configuration of the radio-frequency module 1 will be described.

As illustrated in FIG. 1, the radio-frequency module 1 includes the common terminal 100, transmission power amplifiers 11 and 12, reception low-noise amplifiers 21 and 22, transmission filters 61T, 62T, 63T, and 64T, reception filters 61R, 62R, 63R, and 64R, a transmission output matching network 30, a reception input matching network 40, matching networks 71, 72, 73, and 74, the switches 51, 52, 53, 54, 55, and 56, a coupler 80, and a coupler output terminal 180.

The common terminal 100 is connected to the antenna element 2.

The transmission power amplifier 11 is a power amplifier that amplifies the radio-frequency signals of a communication band A and a communication band B that belong to a first frequency band group. In addition, the transmission power amplifier 12 is a power amplifier that amplifies the radio-frequency signals of a communication band C and a communication band D that belong to a second frequency band group located at a higher frequency than the first frequency band group.

The transmission power amplifier 11 includes an input terminal 114 and an output terminal 111, and a first amplifier 11P and a second amplifier 11D. The first amplifier 11P and the second amplifier 11D are connected between the input terminal 114 and the output terminal 111 and are cascade connected (serially connected) to each other. The first amplifier 11P is arranged in the final stage and the second amplifier 11D is arranged in the stage preceding the first amplifier 11P.

The transmission power amplifier 12 includes an input terminal 124 and an output terminal 121, and a first amplifier 12P and a second amplifier 12D. The first amplifier 12P and the second amplifier 12D are connected between the input terminal 124 and the output terminal 121 and are cascade connected (serially connected) to each other. The first amplifier 12P is arranged in the final stage and the second amplifier 12D is arranged in the stage preceding the first amplifier 12P.

Figure 2A:
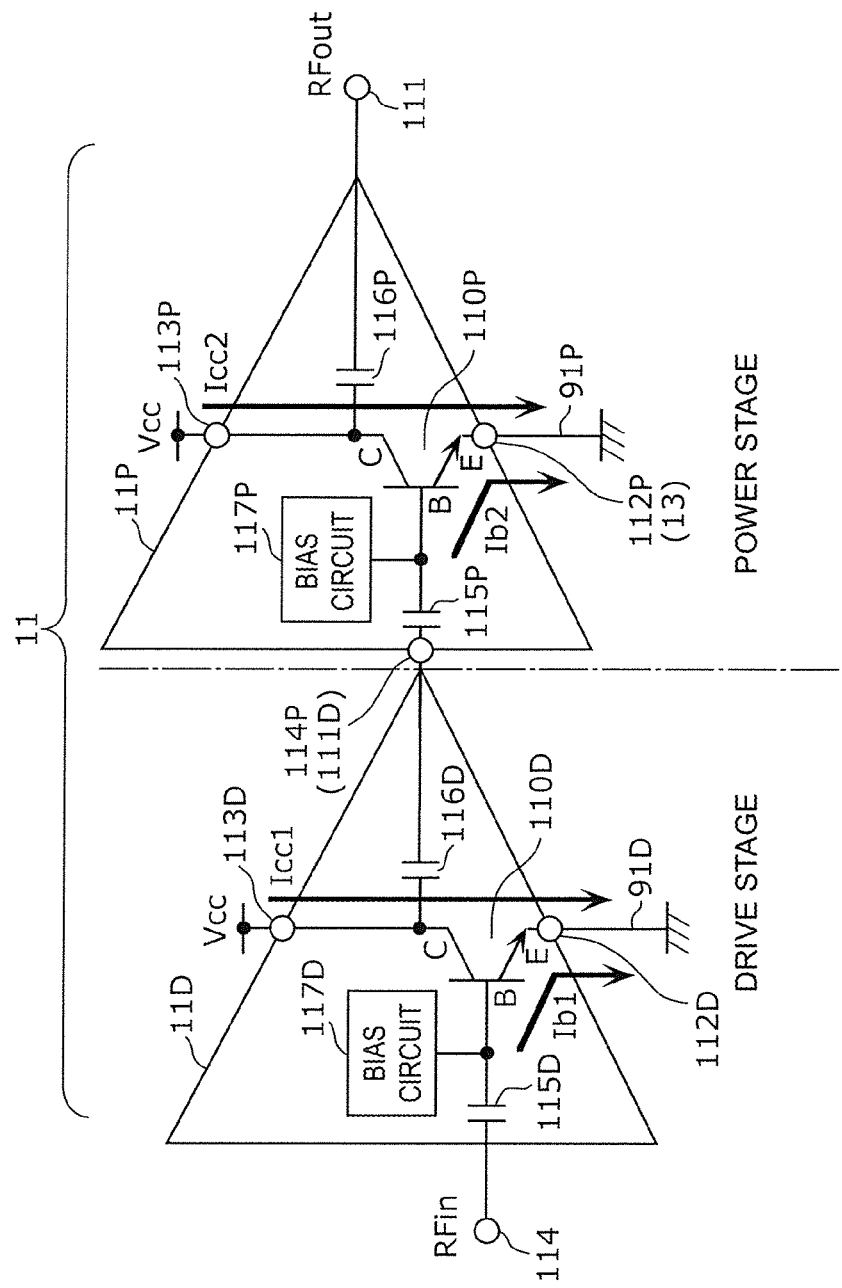
FIG. 2A is a circuit configuration diagram of a power amplifier of the radio-frequency module according to the embodiment.

FIG. 2A is a circuit configuration diagram of the transmission power amplifier 11 according to this embodiment. The transmission power amplifier 11 includes two stages of amplification transistors that are cascade connected to each other. As illustrated in FIG. 2A, the transmission power amplifier 11 includes the first amplifier 11P and the second amplifier 11D.

The first amplifier 11P includes an amplification transistor 110P, capacitors 115P and 116P, a bias circuit 117P, a collector terminal 113P, an emitter terminal 112P, an input terminal 114P, and the output terminal 111.

The amplification transistor 110P is a first amplification element that is arranged in the final stage (power stage) of a plurality of amplification transistors, and for example is a common-emitter bipolar transistor having a collector, an emitter, and a base, and amplifies a radio-frequency current inputted to the base thereof and outputs an amplified radio-frequency current from the collector thereof. The amplification transistor 110P may instead be a field-effect transistor having a drain (corresponds to collector), a source (corresponds to emitter), and a gate (corresponds to base).

The second amplifier 11D includes an amplification transistor 110D, capacitors 115D and 116D, a bias circuit 117D, a collector terminal 113D, an emitter terminal 112D, the input terminal 114, and an output terminal 111D.

The amplification transistor 110D is a second amplification element that is arranged in a stage (drive stage) preceding the amplification transistor 110P arranged in the final stage, and for example is a common-emitter bipolar transistor having a collector, an emitter, and a base, and amplifies a radio-frequency current inputted to the base thereof and outputs an amplified radio-frequency current from the collector thereof. The amplification transistor 110D may instead be a field-effect transistor having a drain (corresponds to collector), a source (corresponds to emitter), and a gate (corresponds to base).

The capacitor 115P is a DC cut capacitance element and functions to prevent a DC current from leaking from the input terminal 114P due to a direct-current bias voltage applied to the base from the bias circuit 117P. The capacitor 115D is a DC cut capacitance element and functions to prevent a DC current from leaking from the input terminal 114 due to a direct-current bias voltage applied to the base from the bias circuit 117D.

The capacitor 116P is a DC cut capacitance element and has a function of removing a direct-current component of a radio-frequency amplified signal on which a direct-current bias voltage has been superimposed, and a radio-frequency amplified signal from which the direct-current component has been removed is outputted from the output terminal 111. The capacitor 116D is a DC cut capacitance element and has a function of removing a direct-current component of a radio-frequency amplified signal on which a direct-current bias voltage has been superimposed, and a radio-frequency amplified signal from which the direct-current component has been removed is outputted from the output terminal 111D.

The bias circuit 117P is connected to and applies a bias voltage to the base of the amplification transistor 110P, and thus has a function of optimizing the operation point of the amplification transistor 110P. The bias circuit 117D is connected to and applies a bias voltage to the base of the amplification transistor 110D, and thus has a function of optimizing the operation point of the amplification transistor 110D.

Here, the emitter terminal 112P is a first ground terminal that is for electrically connecting the first amplifier 11P to ground. The emitter terminal 112D is a second ground terminal that is for electrically connecting the second amplifier 11D to ground.

In other words, the amplification transistor 110P is the first amplification element that is arranged in the final stage of the plurality of amplification transistors and has the first ground terminal, and the amplification transistor 110D is the second amplification element that is arranged in the stage preceding the amplification transistor 110P and has the second ground terminal.

In the circuit configuration of the transmission power amplifier 11 according to this embodiment, a radio-frequency signal RFin that is inputted from the input terminal 114 becomes a base current Ib1 that flows from the base to the emitter of the amplification transistor 110D. The base current Ib1 is amplified by the amplification transistor 110D resulting in a collector current Icc1, and a radio-frequency signal corresponding to the collector current Icc1 is outputted from the output terminal 111D (input terminal 114P).

Furthermore, a radio-frequency signal amplified by the amplification transistor 110D becomes, via the input terminal 114P, a base current Ib2 that flows from the base to the emitter of the amplification transistor 110P. The base current Ib2 is amplified by the amplification transistor 110P resulting in a collector current Icc2, and a radio-frequency signal corresponding to the collector current Icc2 is outputted from the output terminal 111. At this time, a current resulting from the base current Ib1 and the collector current Icc1 being added together flows from the emitter terminal 112D to ground. In addition, a current resulting from the base current Ib2 and the collector current Icc2 being added together flows from the emitter terminal 112P to ground.

The amplification transistors 110P and 110D are for example each formed of a complementary metal oxide semiconductor (CMOS) field effect transistor including Si or a field effect transistor including GaAs as a material, or a bipolar transistor as described above. The amplification transistor 110D, which does not have to handle a high power, is formed of CMOS including Si, and enables the radio-frequency module 1 to be manufactured at low cost. On the other hand, the amplification transistor 110P, which handles a radio-frequency transmission signal having a high power level, is formed of a GaAs-based material, and therefore the amplification transistor 110P can output a radio-frequency transmission signal having excellent amplification and noise characteristics.

Furthermore, the amplification transistor 110D, which does not have to handle a high power, may be formed as a single chip composed of CMOS including Si together with the switches 51 to 55 and a control unit that controls the connections of the switches 51 to 55 and the amplification ratios of the transmission power amplifier 11 and the reception low-noise amplifier 21. Thus, the radio-frequency module 1 can be reduced in size.

In this embodiment, the transmission power amplifiers 11 and 12 are each formed of two stages of amplification elements, but may instead be formed of three or more stages of amplification elements. In this case, the amplification transistor arranged in the final stage among the plurality of amplification transistors would be the first amplification element, and the amplification arranged in the stage preceding the first amplification element would be the second amplification element.

The transmission power amplifier 12 has the same circuit configuration and function as the transmission power amplifier 11.

The reception low-noise amplifier 21 is a low-noise amplifier that amplifies the radio-frequency signals of the communication band A and the communication band B with low noise. In addition, the reception low-noise amplifier 22 is a low-noise amplifier that amplifies the radio-frequency signals of the communication band C and the communication band D with low noise.

The reception low-noise amplifiers 21 and 22 are, for example, each formed of a field effect transistor including CMOS or GaAs as a material or a bipolar transistor.

The transmission filter 61T is electrically connected to the output terminal of the transmission power amplifier 11 via the transmission output matching network 30 and the switch 51 and allows a radio-frequency transmission signal of a transmission band of the communication band A out of a radio-frequency transmission signal amplified by the transmission power amplifier 11 to pass therethrough. In addition, the transmission filter 62T is electrically connected to the output terminal of the transmission power amplifier 11 via the transmission output matching network 30 and the switch 51 and allows a radio-frequency transmission signal of a transmission band of the communication band B out of a radio-frequency transmission signal amplified by the transmission power amplifier 11 to pass therethrough. Furthermore, the transmission filter 63T is electrically connected to the output terminal of the transmission power amplifier 12 via the transmission output matching network 30 and the switch 52 and allows a radio-frequency transmission signal of a transmission band of the communication band C out of a radio-frequency transmission signal amplified by the transmission power amplifier 12 to pass therethrough. In addition, the transmission filter 64T is electrically connected to the output terminal of the transmission power amplifier 12 via the transmission output matching network 30 and the switch 52 and allows a radio-frequency transmission signal of a transmission band of the communication band D out of a radio-frequency transmission signal amplified by the transmission power amplifier 12 to pass therethrough.

The reception filter 61R is electrically connected to an input terminal of the reception low-noise amplifier 21 via the reception input matching network 40 and the switch 53 and allows a radio-frequency reception signal of a reception band of the communication band A out of a radio-frequency reception signal inputted from the common terminal 100 to pass therethrough. In addition, the reception filter 62R is electrically connected to an input terminal of the reception low-noise amplifier 21 via the reception input matching network 40 and the switch 53 and allows a radio-frequency reception signal of a reception band of the communication band B out of a radio-frequency reception signal inputted from the common terminal 100 to pass therethrough. Furthermore, the reception filter 63R is electrically connected to an input terminal of the reception low-noise amplifier 22 via the reception input matching network 40 and the switch 54 and allows a radio-frequency reception signal of a reception band of the communication band C out of a radio-frequency reception signal inputted from the common terminal 100 to pass therethrough. In addition, the reception filter 64R is electrically connected to an input terminal of the reception low-noise amplifier 22 via the reception input matching network 40 and the switch 54 and allows a radio-frequency reception signal of a reception band of the communication band D out of a radio-frequency reception signal inputted from the common terminal 100 to pass therethrough.

The transmission filters 61T to 64T and reception filters 61R to 64R described above may be, for example, formed of any of surface acoustic wave filters, acoustic wave filters that use bulk acoustic waves (BAW), LC resonance filters, and dielectric filters, but are not limited to being formed of these example filters.

The transmission filter 61T and the reception filter 61R form a duplexer 61 having the communication band A as a pass band. The transmission filter 62T and the reception filter 62R form a duplexer 62 having the communication band B as a pass band. The transmission filter 63T and the reception filter 63R form a duplexer 63 having the communication band C as a pass band. The transmission filter 64T and the reception filter 64R form a duplexer 64 having the communication band D as a pass band.

The transmission output matching network 30 includes matching networks 31 and 32. The matching network 31 is arranged on the transmission paths connected between the transmission power amplifier 11 and the transmission filters 61T and 62T, and performs impedance matching between the transmission power amplifier 11 and the transmission filters 61T and 62T. The matching network 32 is arranged on the transmission paths connected between the transmission power amplifier 12 and the transmission filters 63T and 64T, and performs impedance matching between the transmission power amplifier 12 and the transmission filters 63T and 64T.

The reception input matching network 40 includes matching networks 41 and 42. The matching network 41 is arranged on the reception paths connected between the reception low-noise amplifier 21 and the reception filters 61R and 62R and performs impedance matching between the reception low-noise amplifier 21 and the reception filters 61R and 62R. The matching network 42 is arranged on the reception paths connected between the reception low-noise amplifier 22 and the reception filters 63R and 64R and performs impedance matching between the reception low-noise amplifier 22 and the reception filters 63R and 64R.

The switch 51 is arranged on the transmission paths connected between the matching network 31 and the transmission filters 61T and 62T, and switches an electrical connection between the transmission power amplifier 11 and the transmission filter 61T and an electrical connection between the transmission power amplifier 11 and the transmission filter 62T. The switch 52 is arranged on the transmission paths connected between the matching network 32 and the transmission filters 63T and 64T, and switches an electrical connection between the transmission power amplifier 12 and the transmission filter 63T and an electrical connection between the transmission power amplifier 12 and the transmission filter 64T. The switch 53 is arranged on the reception paths connected between the matching network 41 and the reception filters 61R and 62R, and switches an electrical connection between the reception low-noise amplifier 21 and the reception filter 61R and an electrical connection between the reception low-noise amplifier 21 and the reception filter 62R. The switch 54 is arranged on the reception paths connected between the matching network 42 and the reception filters 63R and 64R, and switches an electrical connection between the reception low-noise amplifier 22 and the reception filter 63R and an electrical connection between the reception low-noise amplifier 22 and the reception filter 64R.

The switch 55 is arranged on the signal paths connected between the common terminal 100 and the transmission filters 61T to 64T and the reception filters 61R to 64R, and switches (1) an electrical connection between the common terminal 100 and the transmission filter 61T and the reception filter 61R, (2) an electrical connection between the common terminal 100 and the transmission filter 62T and the reception filter 62R, (3) an electrical connection between the common terminal 100 and the transmission filter 63T and the reception filter 63R, and (4) an electrical connection between the common terminal 100 and the transmission filter 64T and the reception filter 64R. The switch 55 is formed of a multi-connection switch circuit that can simultaneously connect two or more connections out of (1) to (4).

The matching network 71 is arranged on a path connected between the switch 55 and the transmission filter 61T and the reception filter 61R. The matching network 72 is arranged on a path connected between the switch 55 and the transmission filter 62T and the reception filter 62R. The matching network 73 is arranged on a path connected between the switch 55 and the transmission filter 63T and the reception filter 63R. The matching network 74 is arranged on a path connected between the switch 55 and the transmission filter 64T and the reception filter 64R.

The coupler 80 and the switch 56 form a circuit that monitors the power intensity of a radio-frequency signal transmitted between the common terminal 100 and the switch 55 and outputs the monitored power intensity to the RFIC 3 and so forth via the coupler output terminal 180.

According to the above-described circuit configuration, the radio-frequency module 1 is able to perform at least any one of simultaneous transmission, simultaneous reception, and simultaneous transmission and reception of a radio-frequency signal of a communication band that is the communication band A or the communication band B and a radio-frequency signal of a communication band that is the communication band C or the communication band D.

The transmission filters 61T to 64T, the reception filters 61R to 64R, the transmission power amplifier 12, the reception low-noise amplifiers 21 and 22, the matching networks 31, 32, 41, 42, and 71 to 74, the coupler 80, the switches 51 to 56, and the coupler output terminal 180 are not essential constituent elements of the radio-frequency module according to the embodiment of the present disclosure. In other words, it is sufficient that the radio-frequency module 1 according to this embodiment be a circuit that transmits a radio-frequency signal of communication band A and the radio-frequency module 1 has a feature contained in a connection structure between the transmission power amplifier 11 and a mounting substrate (illustrated in FIGS. 3A and 3B) on which the transmission power amplifier 11 is mounted.

2. Circuit Element Arrangement Configuration of Radio-Frequency Module 1

Figure 2B:
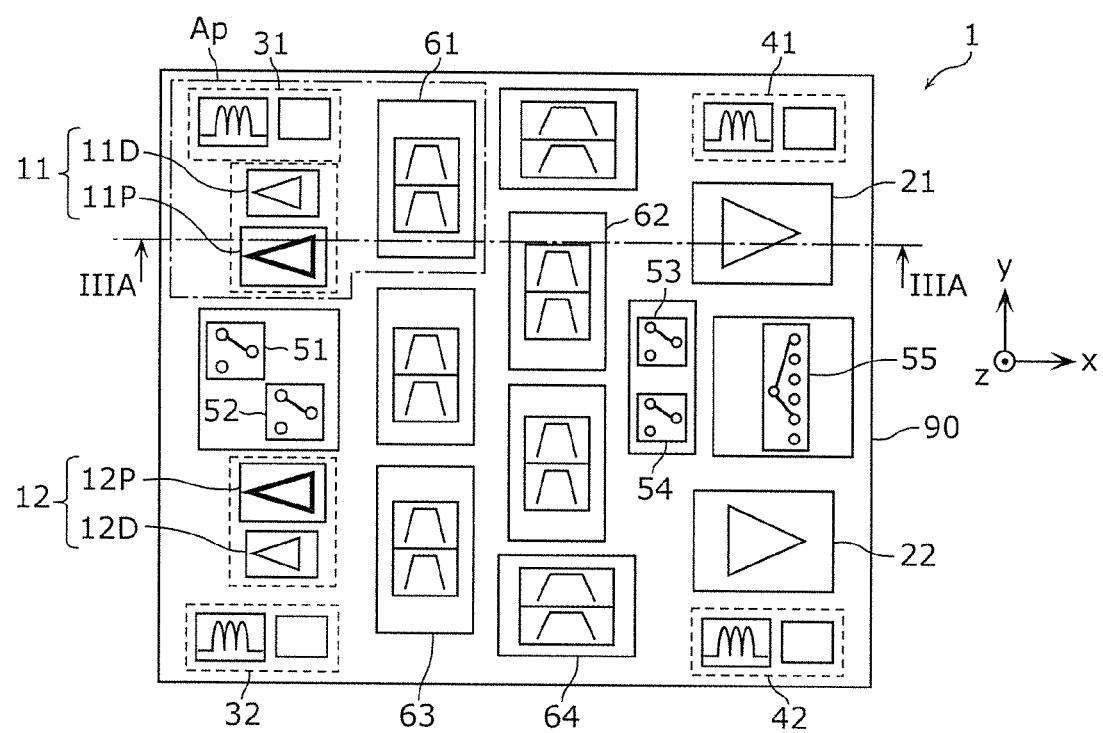
FIG. 2B is a plan view schematic diagram illustrating the circuit arrangement of the radio-frequency module according to the embodiment.
Figure 3A:
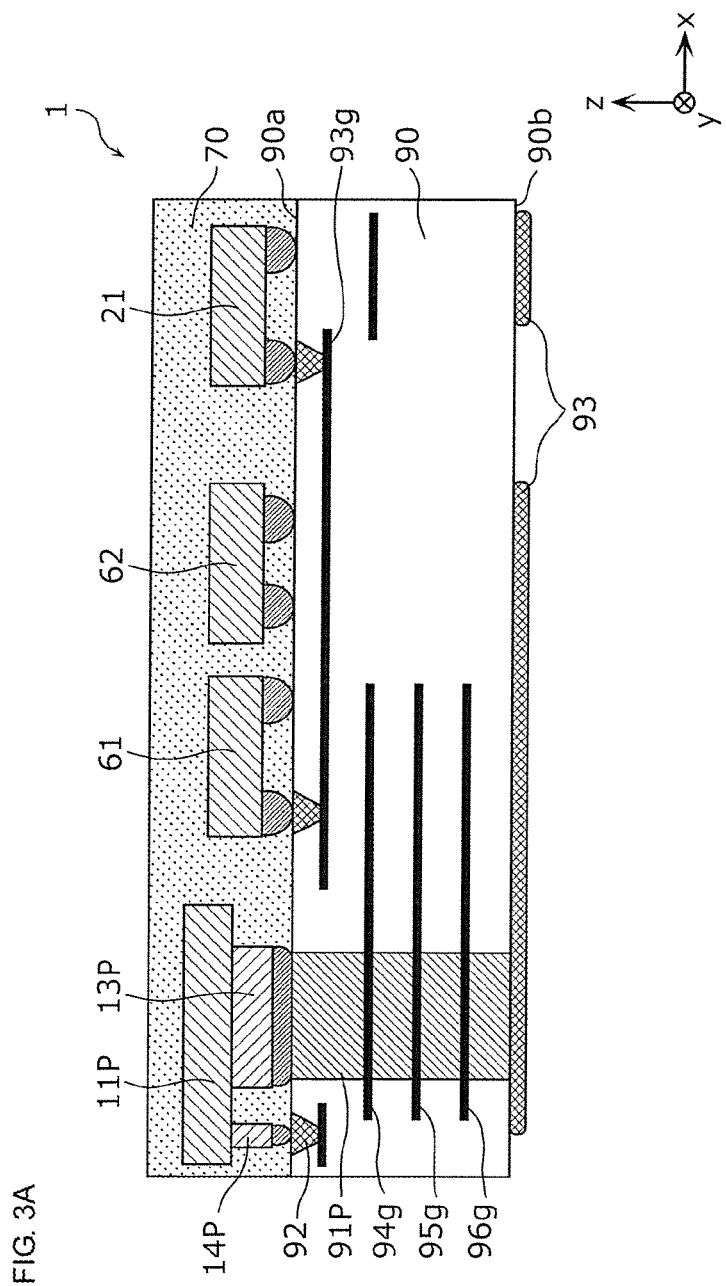
FIG. 3A is a sectional schematic diagram of the radio-frequency module according to the embodiment.

FIG. 2B is a plan view configuration schematic diagram illustrating the circuit arrangement of the radio-frequency module 1 according to the embodiment. FIG. 3A is a sectional schematic diagram of the radio-frequency module 1 according to the embodiment. In addition, each of FIGS. 3B and 3C depicts a sectional schematic diagram and a plan view schematic diagram illustrating the mounting arrangement of the transmission power amplifier 11 of the radio-frequency module 1 according to the embodiment. More specifically, FIG. 3A is a sectional view taken along line IIIA-IIIA in FIG. 2B, FIG. 3C is a plan view of a main surface 90a in a region Ap in FIG. 2B in which the transmission power amplifier 11 is mounted, and FIG. 3B is a sectional view taken along line IIIB-IIIB in FIG. 3C.

As illustrated in FIG. 2B and FIG. 3A, the radio-frequency module 1 according to this embodiment further includes a mounting substrate 90 and a resin member 70 in addition to the circuit configuration illustrated in FIG. 1.

The mounting substrate 90 is a substrate that has the main surface 90a (first main surface) and a main surface 90b (second main surface), which face each other, and on which the circuit elements illustrated in FIG. 1 are mounted. For example, a multilayer substrate composed of a resin or a low temperature co-fired ceramic (LTCC) multilayer substrate composed of a plurality of dielectric layers can be used as the mounting substrate 90.

The resin member 70 is arranged on the main surface 90a of the mounting substrate 90, covers the circuit elements mounted on the main surface 90a and the main surface 90a of the mounting substrate 90, and has a function of securing reliability in terms of mechanical strength, moisture resistance, and so forth for the circuit elements. The resin member 70 is not an essential constituent element of the radio-frequency module according to the embodiment of the present disclosure.

As illustrated in FIGS. 2B and 3A, in the radio-frequency module 1 according to this embodiment, the transmission power amplifiers 11 and 12, the reception low-noise amplifiers 21 and 22, the duplexers 61 to 64, the matching networks 31, 32, 41, and 42, and the switches 51, 52, and 55 are surface mounted on the main surface 90a of the mounting substrate 90. Alternatively, the transmission power amplifier 12, the reception low-noise amplifiers 21 and 22, the duplexers 61 to 64, the matching network 31, 32, 41, and 42, and the switches 51, 52, and 55 may be mounted on the main surface 90b of the mounting substrate 90. Furthermore, although not illustrated in FIG. 2B, the switch 56, the matching networks 71 to 74, and the coupler 80 may be surface mounted on the main surface 90a or 90b of the mounting substrate 90 or may be built into the mounting substrate 90.

The matching circuit 31 is formed of an inductor 31L and a capacitor 31C. The matching circuit 32 is formed of an inductor 32L and a capacitor 32C. The matching circuit 41 is formed of an inductor 41L and a capacitor 41C. The matching circuit 42 is formed of an inductor 42L and a capacitor 42C.

As illustrated in FIG. 2B, in a plan view of the mounting substrate 90, transmission circuit elements consisting of the transmission power amplifier 11 (first amplifier 11P and second amplifier 11D), the transmission power amplifier 12 (first amplifier 12P and second amplifier 12D), the matching networks 31 and 32, and the switches 51 and 52 are arranged on a left-hand region of the mounting substrate 90. On the other hand, reception circuit elements consisting of the reception low-noise amplifiers 21 and 22 and the matching networks 41 and 42 are arranged on a right-hand region of the mounting substrate 90. In addition, in a plan view of the main surface 90a of the mounting substrate 90, the duplexers 61 to 64 are arranged between the transmission circuit elements and the reception circuit elements (in a center region). Thus, transmission-related circuits and reception-related circuits of the radio-frequency module 1 are arranged so as to be spaced apart from each other with the duplexers interposed therebetween, and therefore the isolation between the transmission-related circuits and the reception-related circuits can be improved.

As illustrated in FIGS. 3A and 3B, the radio-frequency module 1 further includes a bump electrode 13P (first bump electrode) and a bump electrode 13D that are connected to the transmission power amplifier 11 and have a long shape in a plan view of the surface of the radio-frequency module 1. The transmission power amplifier 11 (first amplifier 11P and second amplifier 11D) are mounted on the main surface 90a of the mounting substrate 90. As illustrated in FIG. 2A, the first amplifier 11P and the second amplifier 11D respectively have the emitter terminals 112P (first ground terminal) and 112D (second ground terminal). Furthermore, as illustrated in FIG. 3C, the emitter terminal 112P of the first amplifier 11P is connected to the bump electrode 13P and the emitter terminal 112D of the second amplifier 11D is connected to the bump electrode 13D.

The mounting substrate 90 includes via conductors 91P and 91D, which have a long shape in a plan view of the mounting substrate 90. The bump electrode 13P is connected to the via conductor 91P and the bump electrode 13D is connected to the via conductor 91D.

As illustrated in FIG. 3A, the mounting substrate 90 further includes, inside thereof, a plurality of ground electrodes that are substantially parallel to the main surface 90a and consist of a ground electrode layer 93g (first ground electrode layer), a ground electrode layer 94g (second ground electrode layer), a ground electrode layer 95g (third ground electrode layer), and a ground electrode layer 96g (fourth ground electrode layer), in order of proximity to the main surface 90a. The mounting substrate 90 further includes a ground electrode layer 93 formed on the main surface 90b. It is sufficient that the mounting substrate 90 have two or more ground electrode layers inside thereof.

Here, as illustrated in FIG. 3B, the via conductor 91D is connected to the ground electrode layers 93g and 94g, whereas the via conductor 91P is not connected to the ground electrode layer 93g, which is the first ground electrode layer, but is connected to the ground electrode layer 94g, which is the second ground electrode layer.

In other words, the radio-frequency module 1 according to this embodiment includes the transmission power amplifier 11 composed of the plurality of cascade-connected amplification transistors 110P (first amplification element) and 110D (second amplification element) and the mounting substrate 90 having the main surfaces 90a (first main surface) and 90b (second main surface) and having the transmission power amplifier 11 mounted on the main surface 90a thereof. The amplification transistor 110P is arranged in the final stage and has the emitter terminal 112P (first ground terminal). The amplification transistor 110D is arranged in the stage preceding the amplification transistor 110P and has the emitter terminal 112D (second ground terminal). The mounting substrate 90 includes inside thereof the ground electrode layer 93g (first ground electrode layer), the ground electrode layer 94g (second ground electrode layer), the ground electrode layer 95g (third ground electrode layer), and the ground electrode layer 96g (fourth ground electrode layer) in order of proximity to the main surface 90a. Here, the emitter terminal 112P and the emitter terminal 112D are not electrically connected to each other via an electrode on the main surface 90a and are not electrically connected to each other via the ground electrode layer 93g, which is the first ground electrode layer.

In general, an effective way to strengthen the degree of grounding and the heat dissipation performance of a transmission power amplification circuit is to connect a ground terminal of the transmission power amplification circuit to a ground electrode layer inside a mounting substrate. However, in the case where the transmission power amplifier is formed of multiple stages of amplification transistors that are cascade connected to each other in order to realize a high output power, in particular, it is assumed that a high-power radio-frequency signal generated by the amplification transistor of the final stage (power stage) will flow back around to the amplification transistor of the preceding stage (drive stage) via a ground electrode layer inside the mounting substrate. In this case, the radio-frequency signal that flows back around to the amplification transistor of the preceding stage (drive stage) acts as noise in the amplification transistor of the preceding stage (drive stage), and therefore the amplification characteristic of the transmission power amplifier is degraded.

In contrast, with the configuration of the radio-frequency module 1 according to this embodiment, the emitter terminal 112P, which is the ground terminal of the amplification transistor 110P, and the emitter terminal 112D, which is the ground terminal of the amplification transistor 110D, are not electrically connected to each other via an electrode on the main surface 90a of the mounting substrate 90 and are not electrically connected to each other via the ground electrode layer 93g, which is the first ground electrode layer, in the mounting substrate 90. Therefore, since the ground terminal of the amplification transistor 110P and the ground terminal of the amplification transistor 110D are not electrically connected to each other by the shortest path formed close to the surface layer of the main surface 90a of the mounting substrate 90 among paths that pass through the mounting substrate 90, the electrical path between the two ground terminals can be made longer. Therefore, a high-power radio-frequency signal outputted from the amplification transistor 110P of the final stage (power stage) is sufficiently attenuated before flowing into the amplification transistor 110D of the drive stage even when the radio-frequency signal propagates along a ground wiring line. Therefore, the entry of a noise signal from the first amplifier 11P of the power stage to the second amplifier 11D of the drive stage can be suppressed, and therefore the degradation of the amplification characteristics the transmission power amplifier 11 and the radio-frequency module 1 can be suppressed.

In this embodiment, as illustrated in FIG. 3B, the emitter terminal 112P of the first amplifier 11P and the emitter terminal 112D of the second amplifier 11D are not electrically connected to each other via an electrode on the main surface 90a of the mounting substrate 90 and are not electrically connected to each other via the ground electrode layer 93g, which is the first ground electrode layer, in the mounting substrate 90, but are electrically connected to each other via the ground electrode layer 94g, which is the second ground electrode layer, in the mounting substrate 90. With respect to this, the emitter terminal 112P and the emitter terminal 112D do not have to be electrically connected to each other via any ground electrode layer of the mounting substrate 90. In this case, for example, the emitter terminal 112P and the emitter terminal 112D are electrically connected to each other in or on an external substrate arranged so as to face the main surface 90b of the mounting substrate 90. With this configuration, the entry of a noise signal from the first amplifier 11P of the power stage to the second amplifier 11D of the drive stage can be maximally suppressed inside the radio-frequency module 1, and therefore the degradation of the amplification characteristics of the transmission power amplifier 11 and the radio-frequency module 1 can be maximally suppressed.

The bump electrodes 13P and 13D and the via conductors 91P and 91D do not have to have long shapes and may instead have substantially circular shapes, for example. Furthermore, the bump electrodes 13P and 13D do not have to be bumps and may instead be connection electrodes arranged on the surface of the transmission power amplifier 11.

In addition, the bump electrodes 13P and 13D may be omitted and the emitter terminal 112P and the via conductor 91P may be directly connected to each other, and the emitter terminal 112D and the via conductor 91D may be directly connected to each other. In other words, the emitter terminal 112P and the via conductor 91P may be connected to each other at the main surface 90a, and the emitter terminal 112D and the via conductor 91D may be connected to each other at the main surface 90a.

Furthermore, in this embodiment, as illustrated in FIG. 3C, the longitudinal directions of the bump electrode 13P and the via conductor 91P are identical to each other in the plan view, and the bump electrode 13P and the via conductor 91P are connected to each other in an overlapping region in which the bump electrode 13P and the via conductor 91P at least partially overlap in the plan view. Here, the overlapping region of the bump electrode 13P and the via conductor 91P is a region that is long in the longitudinal direction. Here, "the longitudinal directions are identical to each other" does not just refer to a state in which the longitudinal direction of the via conductor 91P and the longitudinal direction of the bump electrode 13P are parallel to each other, and also includes states where the angle formed between the longitudinal direction of the via conductor 91P and the longitudinal direction of the bump electrode 13P is less than or equal to 45°. In addition, "an overlapping region that is long in the longitudinal direction" refers to a region in which a region that is long in the longitudinal direction out of the region occupied by the bump electrode 13P in the plan view and a region that is long in the longitudinal direction out of the region occupied by the via conductor 91P in the plan view overlap each other in the plan view. Furthermore, the longitudinal directions of the bump electrode 13D and the via conductor 91D are identical to each other in the plan view and the bump electrode 13D and the via conductor 91D are connected to each other in an overlapping region in which the bump electrode 13D and the via conductor 91D at least partially overlap in the plan view. Here, the overlapping region of the bump electrode 13D and the via conductor 91D is a region that is long in the longitudinal direction.

"Long shape" refers to a shape that is long in one direction and "longitudinal direction" refers to that one direction.

Consequently, the long-shaped bump electrode 13P and the long-shaped via conductor 91P are connected to each other so as to overlap along the longitudinal direction in the plan view, and therefore the area of contact between the bump electrode 13P and the via conductor 91P is larger than the ones in the related art, and the volumes of the bump electrode 13P and the via conductor 91P are also larger than the ones in the related art. In addition, the long-shaped bump electrode 13D and the long-shaped via conductor 91D are connected to each other so as to overlap along the longitudinal direction in the plan view, and therefore the area of contact between the bump electrode 13D and the via conductor 91D is larger than the ones in the related art, and since the bump electrode 13D and the via conductor 91D have long shapes, the volumes of the bump electrode 13D and the via conductor 91D are also larger than the ones in the related art. Therefore, the heat dissipation performance of the radio-frequency module 1 can be improved.

The bump electrodes 13P and 13D are columnar electrodes having copper (Cu) as a main component, for example. Thus, the bump electrodes 13P and 13D can be easily formed in the above-described long shapes using an electroplating or electroless plating method and the thermal resistance thereof can be reduced compared with other metal materials. Therefore, the manufacturing steps can be simplified and the heat-dissipation performance can be further improved.

In addition, as illustrated in FIG. 2A, the first amplifier 11P includes the amplification transistor 110P, the capacitors 115P and 116P, the bias circuit 117P, the collector terminal 113P, the emitter terminal 112P, the input terminal 114P, and the output terminal 111. The amplification transistor 110P is a common-emitter bipolar transistor having a collector, an emitter, and a base, but may instead be a field effect transistor having a drain (corresponds to collector), a source (corresponds to emitter), and a gate (corresponds to base).

The second amplifier 11D includes the amplification transistor 110D, the capacitors 115D and 116D, the bias circuit 117D, the collector terminal 113D, the emitter terminal 112D, the input terminal 114, and the output terminal 111D. The amplification transistor 110D is a common-emitter bipolar transistor having a collector, an emitter, and a base, but may instead be a field effect transistor having a drain (corresponds to collector), a source (corresponds to emitter), and a gate (corresponds to base).

In this embodiment, the bump electrode 13P connected to the emitter terminal 112P, the via conductor 91P, the bump electrode 13D connected to the emitter terminal 112D, and the via conductor 91D all have long shapes in the plan view. Among these elements, it is desirable that the bump electrode 13P and the via conductor 91P more preferentially have long shapes compared with the bump electrode 13D and the via conductor 91D. As a result, the heat-dissipation performance of the first amplifier 11P that outputs a high power can be preferentially improved, and the radio-frequency module 1 can be made to effectively dissipate heat.

Furthermore, as illustrated in FIGS. 3A and 3B, the radio-frequency module 1 according to this embodiment further includes a bump electrode 14P (second bump electrode) that is connected to the first amplifier 11P and a bump electrode 14D that is connected to the second amplifier 11D. The bump electrode 14P is connected to at least one out of the output terminal 111 and the collector terminal 113P of the first amplifier 11P, and the bump electrode 14D is connected to at least one out of the output terminal 111D and the collector terminal 113D of the second amplifier 11D. In addition, the bump electrode 14P is connected to a substantially circular via conductor 92P provided in the mounting substrate 90, and the bump electrode 14D is connected to a substantially circular via conductor 92D provided in the mounting substrate 90. Here, the area of the bump electrode 13P (first bump electrode) is larger than the area of the bump electrode 14P (second bump electrode) in the plan view. As a result, the plan view area of the bump electrode 13P through which a large current flows is larger than the plan view area of the bump electrode 14P to which a radio-frequency signal or a power source voltage Vcc is applied, and therefore the heat-dissipation performance of the first amplifier 11P can be optimized.

Here, the area of the bump electrode 13D is larger than the area of the bump electrode 14D in the plan view. As a result, the plan view area of the bump electrode 13D is larger than the plan view area of the bump electrode 14D to which a radio-frequency signal or the power source voltage Vcc is applied, and therefore the heat-dissipation performance of the second amplifier 11D can be optimized.

In the radio-frequency module 1 according to this embodiment, the bump electrode 13P and the via conductor 91P completely overlap in the plan view (the via conductor 91P encompasses the bump electrode 13P in the plan view), and the bump electrode 13D and the via conductor 91D completely overlap in the plan view (the via conductor 91D encompasses the bump electrode 13D in the plan view). With respect to this, the longitudinal directions of the bump electrode 13P and the via conductor 91P may be identical to each other in the plan view, the area of part of the bump electrode 13P may overlap the via conductor 91P, and the area of the remaining part of the bump electrode 13P may overlap a non-conductive part of the mounting substrate 90. In addition, the longitudinal directions of the bump electrode 13D and the via conductor 91D may be identical to each other in the plan view, the area of part of the bump electrode 13D may overlap the via conductor 91D, and the area of the remaining part of the bump electrode 13D may overlap a non-conductive part of the mounting substrate 90.

A "non-conductive part of the mounting substrate 90" consists of the body of the mounting substrate 90 that contacts the outer peripheries of the via conductors in the plan view. The non-conductive part of the mounting substrate 90 consists of a resin material constituting the body of the multilayer substrate in the case where the mounting substrate 90 is a multilayer substrate composed of a resin, for example. Furthermore, the non-conductive part consists of a ceramic material constituting the body of an LTCC substrate in the case where the mounting substrate 90 is an LTCC substrate.

In other words, the bump electrode 13P may include a region that does not overlap the via conductor 91P and does overlap the non-conductive part in the plan view. In addition, the bump electrode 13D may include a region that does not overlap the via conductor 91D and does overlap the non-conductive part in the plan view.

The long-shaped via conductors 91P and 91D are, for example, formed by first forming holes in the mounting substrate 90 using a laser or the like, and then filling the holes with a conductor material (for example, a conductive paste) such as silver (Ag) or copper (Cu). Since the long-shaped via conductors 91P and 91D do not have perfectly circular shapes in the plan view, when the holes are filled with the conductor material when forming the via conductors 91P and 91D, the amount of conductor material filled in a via inner peripheral region may be smaller than that filled in a via outer peripheral region. Therefore, it is assumed that it will be more likely for recesses to occur in the main surface 90a of the mounting substrate 90 in the via inner peripheral region than in the via outer peripheral region and it will be difficult to secure the flatness for the via conductors 91P and 91D at the main surface 90a of the mounting substrate 90. On the other hand, the flatness is secured at the main surface 90a of the mounting substrate 90 for the non-conductive parts that surround the via conductors 91P and 91D in the plan view.

Thus, it is possible to ensure that the transmission power amplifier 11 is flat on the mounting substrate 90 using the connections between the bump electrode 13P and the bump electrode 13D and the non-conductive parts while improving the heat-dissipation performance of the radio-frequency module using the connection between the bump electrode 13P and the via conductor 91P.

Furthermore, since it is not necessary for a bump electrode and a via conductor to completely overlap, the arrangement positions of the via conductors 91P and 91D in the mounting substrate 90 can be chosen with a certain degree of freedom and a heat-dissipating region inside the mounting substrate 90 can be changed. In particular, it is also possible to arrange the via conductors 91P and 91D so as to be spaced apart from components having characteristics that are greatly changed by heat for example and it is thus possible to stabilize the electrical characteristics of the radio-frequency module.

In addition, the surface areas of the via conductors 91P and 91D at the main surface 90a may be smaller than the areas of the bump electrodes 13P and 13D. Thus, the via conductors 91P and 91D can be reduced in size, and consequently the degree of freedom when designing the arrangement of the via conductors 91P and 91D inside the mounting substrate 90 can be improved.

FIG. 4 is a sectional schematic diagram of a radio-frequency module 1A according to a modification of the embodiment. The radio-frequency module 1A according to this modification differs from the radio-frequency module 1 according to the embodiment only with respect to the structures of the bump electrodes that are connected to the first amplifier 11P and the via conductors that are connected to the bump electrodes. Hereafter, the description of the radio-frequency module 1A according to this modification will focus on the points that are different from the radio-frequency module 1 according to the embodiment and description of points that are the same will be omitted.

As illustrated in FIG. 4, the first amplifier 11P is mounted on the main surface 90a of the mounting substrate 90. The first amplifier 11P has the emitter terminal 112P, and the emitter terminal 112P is connected to bump electrodes 13a, 13b, 13c, and 13d. The bump electrodes 13a to 13d each have a substantially circular shape in the plan view and are arranged in a discrete manner along an x-axis direction.

The mounting substrate 90 includes via conductors 91a, 91b, 91c, and 91d. The via conductors 91a to 91d penetrate through the mounting substrate 90, each have a substantially circular shape in the plan view, and are arranged in a discrete manner along the x-axis direction.

Here, the bump electrode 13a is connected to the via conductor 91a, the bump electrode 13b is connected to the via conductor 91b, the bump electrode 13c is connected to the via conductor 91c, and the bump electrode 13d is connected to the via conductor 91d.

In the radio-frequency module 1A according to this modification, the emitter terminal 112P and the emitter terminal 112D are not electrically connected to each other via an electrode on the main surface 90a of the mounting substrate 90 and are not electrically connected to each other via the ground electrode layer 93g, which is the first ground electrode layer, in the mounting substrate 90. Thus, the entry of a noise signal from the first amplifier 11P of the power stage to the second amplifier 11D of the drive stage can be suppressed, and therefore the degradation of the amplification characteristics of the transmission power amplifier 11 and the radio-frequency module 1A can be suppressed.

In addition, the via conductors 91a to 91d may instead be formed of one via conductor having a long shape in the plan view inside the mounting substrate 90. In other words, depending on the heat-dissipation performance and grounding strength required by the radio-frequency module 1A, the via conductors 91a to 91d arranged in a discrete manner or a long-shaped via conductor may be individually provided for each layer of the mounting substrate 90.

In the radio-frequency modules according to the embodiment and modification described above, the long-shaped bump electrodes 13P and 13D are assumed to bump electrodes that are connected to the transmission power amplifier 11, but the long-shaped bump electrodes 13P and 13D may instead be bump electrodes that are connected to the transmission power amplifier 12.

Other Embodiments Etc.

The radio-frequency module and communication device according to the embodiment described above have been described in the form of an embodiment and a modification of the embodiment, but a radio-frequency module and communication device according to the present disclosure are not limited to this embodiment and modification. Other embodiments realized by combining any of the constituent elements of the above-described embodiment and modification with one another, modifications obtained by modifying the above-described embodiment and modification in various ways, as thought of by one skilled in the art, while not departing from the gist of the present disclosure, and various devices having the radio-frequency module and communication device built thereinto are included in the present disclosure.

For example, in the radio-frequency modules and communication devices according to the embodiment and modification described above, other circuit elements, wiring lines, and so forth may be inserted midway along paths that connect the circuit elements and signal paths disclosed in the drawings.

The present disclosure can be widely used in communication devices such as mobile phones as a radio-frequency module that is arranged in a multi-band front end unit.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio-frequency module comprising:
a power amplifier composed of a plurality of cascade-connected amplification elements; and
a mounting substrate having a first main surface and a second main surface that face each other, the power amplifier being mounted on the first main surface;
wherein the plurality of amplification elements includes
a first amplification element arranged in a final stage of the plurality of amplification elements and having a first ground terminal, and
a second amplification element arranged in a stage preceding the first amplification element and having a second ground terminal,
an inside of the mounting substrate includes a plurality of ground electrode layers substantially parallel to the first main surface and having first to nth ground electrode layers in order of proximity to the first main surface, wherein n is an integer greater than or equal to 2 and
the first ground terminal and the second ground terminal are not electrically connected to each other via an electrode on the first main surface of the mounting substrate and are not electrically connected to each other via the first ground electrode layer.

2. The radio-frequency module according to claim 1, wherein the first ground terminal and the second ground terminal are not connected to each other via the plurality of ground electrode layers of the mounting substrate.

3. The radio-frequency module according to claim 1, wherein the mounting substrate includes a via conductor having a long shape in a plan view of the mounting substrate, and
the first ground terminal and the via conductor are connected to each other at the first main surface.

4. The radio-frequency module according to claim 1, further comprising:
a connection electrode connected to a surface of the power amplifier;
wherein the mounting substrate includes a via conductor having a long shape in a plan view of the mounting substrate, and
the connection electrode and the via conductor are connected to each other at the first main surface.

5. The radio-frequency module according to claim 4, wherein the connection electrode is a first bump electrode having a long shape in the plan view,
longitudinal directions of the first bump electrode and the via conductor are identical to each other in the plan view, and the first bump electrode and the via conductor are connected to each other in an overlapping region in which the first bump electrode and the via conductor at least partially overlap in the plan view, and
the overlapping region is a region being long in the longitudinal directions.

6. The radio-frequency module according to claim 5, wherein the first amplification element is a bipolar transistor having a base terminal, a collector terminal, and an emitter terminal, and wherein a driving current flows from the collector terminal to the emitter terminal in the bipolar transistor, and
the emitter terminal is the first ground terminal.

7. The radio-frequency module according to claim 6, further comprising:
a second bump electrode connected to the surface of the power amplifier;
wherein the second bump electrode is connected to the base terminal and/or the collector terminal, and
an area of the first bump electrode is larger than an area of the second bump electrode in the plan view.

8. The radio-frequency module according to claim 5, wherein the first amplification element is a field effect transistor having a gate terminal, a drain terminal, and a source terminal, and wherein a driving current flows from the drain terminal to the source terminal in the field effect transistor, and
the source terminal is the first ground terminal.

9. The radio-frequency module according to claim 8, further comprising:
a second bump electrode connected to the surface of the power amplifier;
wherein the second bump electrode is connected to the gate terminal and/or the drain terminal, and
an area of the first bump electrode is larger than an area of the second bump electrode in the plan view.

10. The radio-frequency module according to claim 5, wherein the first bump electrode is a columnar electrode having copper as a main component.

11. The radio-frequency module according to claim 5, wherein the mounting substrate further includes a non-conductive part consisting of a body of the mounting substrate and contacting with an outer periphery of the via conductor, and
the first bump electrode includes a region not overlapping the via conductor and overlapping the non-conductive part in the plan view.

12. A communication device comprising:
an RF signal processing circuit processing a radio-frequency signal transmitted or received by an antenna element; and
the radio-frequency module according to claim 1, the radio-frequency module transmitting the radio-frequency signal between the antenna element and the RF signal processing circuit.

13. The radio-frequency module according to claim 2, wherein the mounting substrate includes a via conductor having a long shape in a plan view of the mounting substrate, and
the first ground terminal and the via conductor are connected to each other at the first main surface.

14. The radio-frequency module according to claim 2, further comprising:
a connection electrode connected to a surface of the power amplifier;
wherein the mounting substrate includes a via conductor having a long shape in a plan view of the mounting substrate, and
the connection electrode and the via conductor are connected to each other at the first main surface.

15. The radio-frequency module according to claim 6, wherein the first bump electrode is a columnar electrode having copper as a main component.

16. The radio-frequency module according to claim 7, wherein the first bump electrode is a columnar electrode having copper as a main component.

17. The radio-frequency module according to claim 8, wherein the first bump electrode is a columnar electrode having copper as a main component.

18. The radio-frequency module according to claim 9, wherein the first bump electrode is a columnar electrode having copper as a main component.

19. The radio-frequency module according to claim 10, wherein the first bump electrode is a columnar electrode having copper as a main component.

20. The radio-frequency module according to claim 6, wherein the mounting substrate further includes a non-conductive part consisting of a body of the mounting substrate and contacting with an outer periphery of the via conductor, and the first bump electrode includes a region not overlapping the via conductor and overlapping the non-conductive part in the plan view.

* * * * *